(12) United States Patent
Bancel et al.

(10) Patent No.: US 7,676,717 B2
(45) Date of Patent: Mar. 9, 2010

(54) ELECTRONIC CIRCUIT COMPRISING A TEST MODE SECURED BY THE BREAKING OF A TEST CHAIN, AND ASSOCIATED ELECTRONIC CIRCUIT

(75) Inventors: Frédéric Bancel, Lamanon (FR); David Hely, Marseille (FR)

(73) Assignee: STMicroelectronics SA, Montrouge (FR)

( * ) Notice: Subject to any disclaimer, the term of this patent is extended or adjusted under 35 U.S.C. 154(b) by 601 days.

(21) Appl. No.: 11/673,911

(22) Filed: Feb. 12, 2007

(65) Prior Publication Data

US 2007/0234156 A1    Oct. 4, 2007

(30) Foreign Application Priority Data

Feb. 10, 2006    (FR) .................................. 06 01180

(51) Int. Cl.
*G01R 31/28*    (2006.01)
(52) U.S. Cl. ....................... 714/726; 714/728
(58) Field of Classification Search .................. None
See application file for complete search history.

(56) References Cited

U.S. PATENT DOCUMENTS 5,646,567 A * 7/1997 Felix ........................ 327/202
6,389,567 B2 * 5/2002 Porteners et al. ............. 714/733
6,499,124 B1   12/2002 Jacobson ..................... 714/727
7,565,591 B2 * 7/2009 Dingemanse ................ 714/726

FOREIGN PATENT DOCUMENTS

EP      1560031       8/2005
WO   2007/017839    2/2007

* cited by examiner

*Primary Examiner*—Christine T Tu
(74) *Attorney, Agent, or Firm*—Lisa K. Jorgenson; Allen, Dyer, Doppelt, Milbrath & Gilchrist, P.A.

(57) ABSTRACT

An electronic circuit includes configurable cells with a test input and an output. The configurable cells are capable of being connected to one another in a chain in a predefined order via the test inputs and the outputs to form a test shift register if they receive a chaining command signal. A connection control module disconnects the test input from at least one configurable cell if the connection control module receives an invalid identification key. The connection control module leaves disconnected the test input from the at least one configurable cell, or applies a constant potential on the test input of the at least one configurable cell, or connects the test input of the at least one configurable cell at an output of a random-data generator.

32 Claims, 2 Drawing Sheets

ELECTRONIC CIRCUIT COMPRISING A TEST MODE SECURED BY THE BREAKING OF A TEST CHAIN, AND ASSOCIATED ELECTRONIC CIRCUIT

FIELD OF THE INVENTION

The invention generally relates to synchronous electronic integrated circuits provided with combination logic and flip-flop circuits that can operate in a test mode.

More specifically, the invention relates to an electronic circuit comprising a plurality of configurable cells configured according to a chaining command signal in a functional state in which the configurable cells are functionally linked to logic cells that cooperate to form at least one logic circuit, or in a chained state in which the configurable cells are functionally connected in a chain to form a shift register.

BACKGROUND OF THE INVENTION

There are well-known ways of testing for the proper operation of the functional elements of an integrated circuit. This is done by the imposition and/or determination at predefined instants of the values of data present at certain internal points of the integrated circuit. A technique of this kind for testing the internal paths of an integrated circuit, known as a scanpath or an internal scan method, is described for example in "Enhancing Testability of LSI Circuits Via Test Points and Additional Logic," M. Williams and J. Angel, IEEE Transactions on Computers, Vol. C-22, No. 1, January 1973.

In this technique, each of the flip-flop circuits of the logic circuit, for which it is necessary to know the state and/or impose the content during the standard operation of the integrated circuit, is provided with a multiplexer at its input. The different flip-flop circuits and the multiplexers that are associated with them thus constitute an equivalent number of configurable cells whose access points are controlled by the multiplexers.

The multiplexers are collectively controlled by a TAP (test access port) controller which, depending on a command signal defining a selected mode of operation, uses the set of configurable cells either as a standard functional circuit integrated with the logic circuit that it forms with the logic cells, or as a test circuit.

To do this, the TAP controller receives command signals on different command conductors and/or address conductors by which it is connected to the different configurable cells. The command signals are for example a mode command signal, a chaining command signal or a data-propagation command signal that permit the modification of and/or modify the data circulation paths within the integrated circuit. The command signals also permit the controller to capture data for subsequent analysis.

In a standard operating mode, the TAP controller therefore drives the multiplexers of the configurable cells so that the flip-flop circuits of these cells are connected to surrounding logic cells to define one or more functional sub-units of the integrated circuit.

In the test mode, which is normally activated upon reception by the TAP controller of a command signal commanding passage into the test mode, the controller produces a chaining command signal to set up a series connection of the flip-flop circuits of the configurable cells so as to form a shift register. This register has a series input and a series output respectively connected to one output and to one input of the TAP controller, as well as a clock input receiving a clock signal to set the rate of the data stream flowing in the shift register.

Initially, the TAP controller serially loads data into the flip-flop circuits of the configurable cells through the input of the shift register formed by these configurable cells. Then, the TAP controller changes the switching of the multiplexers to form the functional circuit, and commands execution of one or more clock cycles by the functional circuit. In this phase, the data loaded into the flip-flop circuits of the configurable cells are processed by the functional circuit.

The controller then changes switching of the multiplexers once again to form the shift register once again and serially retrieves, at an output of the shift register, the data stored in the flip-flop circuits of the configurable cells during the last clock cycle. Despite the confirmed value of this testing technique, its practical application can be a problem in certain circumstances, especially in integrated circuits that process secret data.

Inasmuch as the activation of the test mode may enable a fraudulent individual to read the contents of the flip-flop circuits of the configurable cells, this test technique has the drawback of making such circuits very vulnerable to fraudulent use. For example, by stopping a process of internal loading of secret data into the integrated circuit at various points in time, and by unloading the contents of the shift register, a fraudulent individual could obtain information on secret data or even reconstruct the secret data.

By activating the test mode, a fraudulent individual could also obtain write access to the flip-flop circuits of the configurable cells to insert fraudulent data or to place the integrated circuit in an unauthorized configuration. The fraudulent individual could thus, for example, access a register controlling a security element such as a sensor to deactivate it. False data could be injected in order to obtain information on secret data.

The fraudulent individual may actually adopt two different strategies. The first strategy includes taking control of the TAP controller and observing the contents of the cells of the shift register at the external pads. The second strategy includes taking control of the configurable cells by exciting them by micro-probing so as to simulate the driving of the cells by the command signals emitted by the TAP controller.

A prior art electronic circuit, described in the European patent application no. 1,560,031, is designed to thwart an attempt at fraud using the second strategy. In this application, the electronic circuit comprises a connection control module appropriate to carrying out the following as a function of an identification key. The configurable cells are chained in a predetermined order to form the test shift register if the identification key is valid, or if not, then chaining the configurable cells in a random order to form a diversion circuit. The diversion circuit is formed by the same configurable cells connected together in an order different from the predetermined order, and chosen randomly at each formation of a diversion circuit.

Thus, in the circuit in the '031 patent application, the shift register records or writes data fraudulently (i.e., without accurate self-identification), and the data are actually written or read in a diversion circuit. Thus, the data will either not have the expected effect on the logic circuit or will have no meaning during the reading. Thus, it becomes difficult to fraudulently retrieve a secret key that might be stored in the logic circuit.

A drawback of the circuit in the '031 patent application is the fact that, to be truly efficient, it is necessary in the connection control module to use very large-sized multiplexers having a very large number of inputs in order to be able to set up a large number of different diversion circuits. The security of the circuit is indeed proportional to the number of diversion circuits that can be made randomly. The use of large-sized multiplexers first implies difficulty in making the circuit, and secondly, high consumption for the circuit including the standard mode of operation.

Also, the efficiency of the circuit in the '031 patent application increases with the frequency of reconnection of the diversion circuits, but increasing this frequency also significantly increases the consumption of the circuit. Finally, the data contained in a diversion circuit are the data initially contained in the test shift register. So, even if the data are mixed up during the formation of the diversion circuit, there is always a risk that the data may be read and exploited by a fraudulent individual.

SUMMARY OF THE INVENTION

In view of the foregoing background, an object of the invention is to provide a circuit that protects against microprobing attacks but is more straightforward and easier to make.

The electronic circuit in accordance with the present invention comprises configurable cells comprising a test input and an output. The configurable cells may be capable of being connected to one another in a chain in a predefined order by way of their test input and their output to form a test shift register if they receive a chaining command signal.

The electronic circuit further comprises a connection control module adapted for disconnecting the test input from at least one configurable cell if the connection control module receives an invalid identification key. The connection control module is also adapted for leaving disconnected the test input from the at least one configurable cell, or applying a constant potential on the test input of the at least one configurable cell, or connecting the test input of the at least one configurable cell at an output of a random-data generator.

Thus, if the connection module receives an invalid identification key or does not receive any identification key, it disconnects the test input of at least one configurable cell from the output of the preceding configurable cell. This prevents the accurate formation of the test shift register. Also, the disconnected test input is left disconnected, or connected to the output of a constant potential generator, or connected to the output of a random-data generator. Thus, the configurable cell, which has been disconnected from the output of the precedent configurable cell, receives data totally independent from the data eventually still contained in the test shift register. It therefore becomes very difficult to record or read data accurately in the test shift register.

Preferably, the connection control module is adapted to disconnecting the test input of several configurable cells if it receives an invalid identification key. The security of the circuit indeed increases with the number of configurable cells that are disconnected by the connection control module. The number of configurable cells that may be disconnected is a compromise between (a) the security of the circuit, and (b) the complexity and difficulty of making the circuit. All these parameters increase with the number of cells that may be disconnected.

The cells that may be disconnected may, for example, be evenly distributed over all the configurable cells. The other configurable cells remain interconnected by way of their test input and their output.

However, it is preferable that the choice of cells to be disconnected should be made randomly from among the set of configurable cells. It thus becomes more difficult for a fraudulent individual to find those cells of the configurable cells that are to be disconnected. The security of the circuit is thus increased.

Preferably again, the connection control module is also adapted to applying random data to the test input of the disconnected configurable cell or cells. A control module such as this thus enables the recording of the noise (the random data) in the configurable cells that are still connected.

Thus, a fraudulent individual trying to record or read data in the configurable cells without performing a proper preliminary self-identification would essentially record or write random data that would either not have the expected effect on the logic circuit or be meaningless during reading. The random data furthermore have the effect of deceiving the fraudulent individual who has the impression of accessing the total test register.

In a preferred embodiment, the connection control module may comprises an identification module to receive the identification key and produce a validation signal if the key is valid, and at least one multiplexer associated with a configurable cell to be disconnected The at least one multiplexer has an input for the formation of the shift register and connected to the data output of a configurable cell preceding the configurable cell to be disconnected, a data input, a selection input connected to an output of the identification module, and an output connected to the test input of the configurable cell to be disconnected.

If it receives a validation signal, the multiplexer reproduces, at its output, the state of its shift-register forming input. If not, if it does not receive the validation signal, the multiplexer reproduces the state of its data input at its output. The data input of the multiplexer may remain unconnected, or connected to a constant potential. However, the connection control module preferably also has a random data generator having one output connected to the data input of the multiplexer.

Several configurable cells may be disconnected. The connection control module may comprise several multiplexers, each respectively associated with one of the configurable cells to be disconnected.

The making of the configurable cells is well known by those skilled in the art, and is described in detail further below. The circuit according to the invention may also include a control circuit such as a TAP controller to produce the command signals necessary for the reading and writing in the test shift register, especially the chaining command signal and the data propagation signal. However, these signals may also be produced by a TAP controller external to the circuit of the invention and connected to an input/output interface of the circuit of the invention.

If the TAP controller is internal to the electronic circuit, it could be chosen to include or not include the connection control module in this TAP controller.

Another aspect of the invention is directed to a chip card comprising an electronic circuit as described above.

BRIEF DESCRIPTION OF THE DRAWINGS

The invention will be understood more clearly and other features and advantages will appear from the following description of examples of implementation of an electronic circuit according to the invention. The description, given by way of an indication that is in no way exhaustive, is made with reference to the appended drawings, of which.

DETAILED DESCRIPTION OF THE PREFERRED EMBODIMENTS

Figure 1:
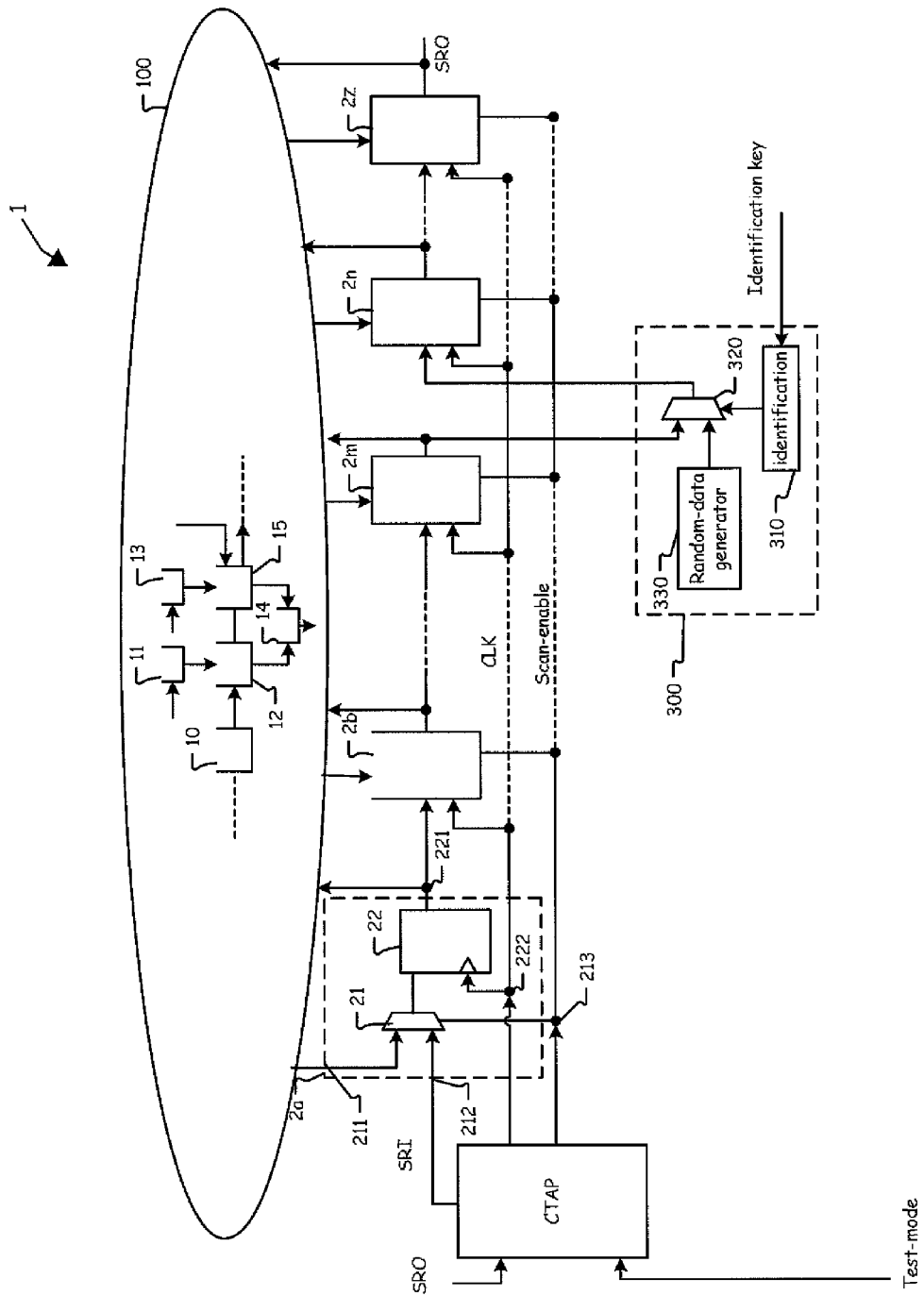
FIG. 1 is a drawing of a first embodiment of a circuit according to the invention.

FIG. 1 illustrates a first example of an electronic circuit 1 according to the invention. The circuit 1 is an integrated circuit which, like the above described prior art circuit, comprises a logic circuit 100 comprising a plurality of logic cells 10 to 15. The circuit 1 also has configurable cells such as the cells 2a to 2z that may be connected to the logic cells to form at least one functional circuit.

These configurable cells 2a to 2z may also be connected to one another to form a test shift register, and may receive command signals, especially a chaining command signal SCAN_ENABLE and a data propagation signal CLK to record or read data in the configurable cells.

The configurable cells are well known by those skilled in the art and are all identical. Hence, only the first cell 2a is described in detail in FIG. 1. A configurable cell typically comprises a functional input connected to the logic circuit 100, and a test input connected to an output of a preceding cell. The test input of the first cell 2a forms the input SRI of the test register to which data to be loaded into the test register are to be applied. A chaining command input receives the signal SCAN_ENABLE, a propagation command input receives the signal CLK and an output is connected firstly to the logic circuit 100, and secondly, to the data input of a following configurable cell. The output of the last configurable cell 2z forms the data output SRO of the test register. A configurable cell typically comprises a multiplexer and a D type latch circuit 22.

A first input 211 of the multiplexer 21 forms the functional input of the configurable cell, and a second input 212 of the multiplexer 21 forms the test input of the configurable cell. A selection pad 213 of the multiplexer 21 forms the chaining command input of the configurable cell, and enables the selective reproduction, at the output of the multiplexer, of either the state of its first input or the state of its second input. One output of the multiplexer 21 is connected to a data input of the D latch circuit 22. An output 221 of the latch circuit 22 forms the data output of the configurable cell and is connected firstly to the logic circuit 100, and secondly to the second input 212 of the multiplexer 21 of the next configurable cell. For its part, the data output 221 of the latch circuit 22 of the last configurable cell 2z forms the output SRO of the test register.

The D latch circuit also has a clock input 222 forming the propagation command input of the configurable cell to receive the data propagation signal. The D latch circuit may possibly be controlled in the test mode at a test frequency different from the normal operating frequency of the circuit 100.

In the prior art, the pad 213 typically receives a chaining command signal called SCAN_ENABLE provided in a known manner by a TAP controller. As described in the introduction, an internal path test on the logic circuit 100 is performed by the initial application of a signal SCAN_ENABLE to the pad 213 of the multiplexers.

The configurable cells are then all chained to form a test shift register. This shift register is then loaded with the data applied to its input SRI (which corresponds to the second input 212 of the multiplexer of the first configurable cell 2a). The pace of the loading is set by the data propagation signal CLK. The application of the signal SCAN_ENABLE to the pad 213 is then stopped to form a functional circuit in which the configurable cells are connected to the logic cells. The functional circuit performs one or more clock cycles with the loaded data.

The signal SCAN_ENABLE is applied again to form the test register, and then the data recorded in the test register are read at its output SRO which corresponds to the output of the latch circuit 22 of the last configurable cell.

In particular, the electronic circuit protects against a microprobing attack. Such an attack might include applying a micro-probe to a control of the pads 213 in order to form the test shift register fraudulently, and in applying another microprobe to record or read data in this test register.

The electronic circuit also comprises a connection control module 300 to disconnect the test input of at least one configurable cell if the connection control module receives an invalid identification key. The connection control module 300 also leaves disconnected the test input from the at least one configurable cell, or applies a constant potential on the test input of the at least one configurable cell, or connects the test input of the at least one configurable cell at an output of a random-data generator.

The connection control module 300 has an input 301 for reception of an identification key. The identification key may take the form of a word having an appropriate number of bits. If an accurate key is applied to the input 301, the control module 300 is inactive and the configurable cells are either connected in a chain if they receive the signal SCAN_ENABLE or, if not, they are connected to the logic cells.

If no identification key is applied to the input 301 or if a wrong identification key is applied, the module 300 disconnects the test input from at least one configurable cell so that, if the cells receive a chaining command signal SCAN_ENABLE, the test register is not correctly formed.

FIG. 1 provides a detailed illustration of an exemplary embodiment of a control module according to the invention which, in the example, is appropriate to disconnecting the test input of the cell 2n from the output of the cell 2m. To this end, the connection control module has an identification module 310 and the multiplexer 320.

The identification module 310 has an input capable of receiving an identification key and an output at which it produces a validation signal VAL if it receives an invalid identification key. The identification module 320 is not described in detail in FIG. 1. It may, for example, comprise a comparator with an input connected to the input of the identification module, an input to which is applied a reference key (which, for example, is a data word stored in a register of the electronic circuit) and an output connected to the output of the identification module.

The multiplexer 320 has a test register formation input connected to the output of the cell 2m, a data input, a selection input connected to the output of the identification module and an output connected to the test input of the cell 2n. When the validation signal is present, the multiplexer 320 reproduces the state of its test register formation input at its output. On the contrary, when the validation signal is absent (i.e., when the identification key is invalid or not provided), the multiplexer 320 reproduces the state of its data input at its output.

In the example of FIG. 1, the connection control module 300 is also adapted to applying random data to the test input of the disconnected configurable cell 2n. To this end, the connection control module comprises a random-data generator 330 having one output connected to the data input of the multiplexer.

Figure 2:
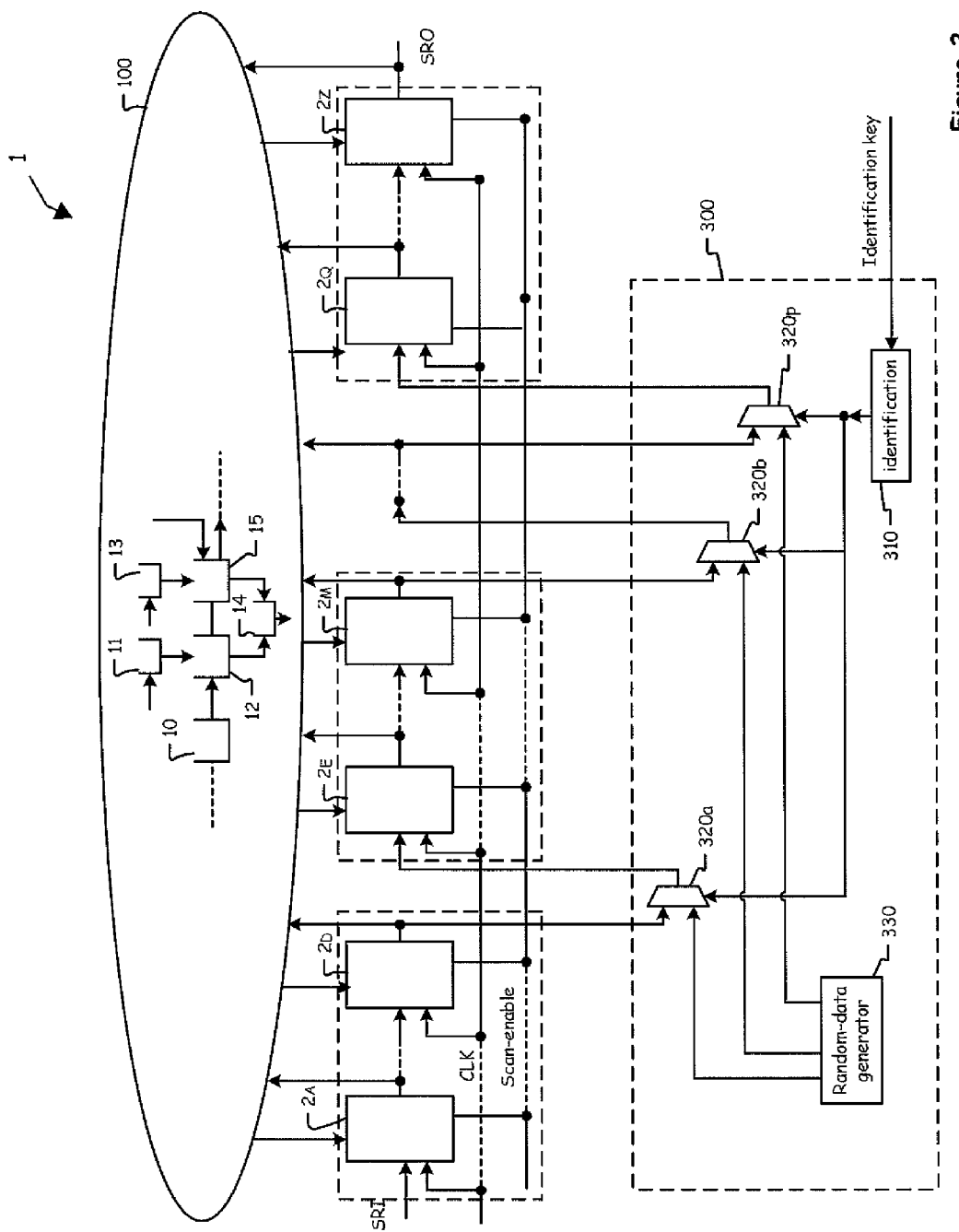
FIG. 2 is a drawing of a second embodiment of a circuit according to the invention.

FIG. 2 illustrates a second exemplary embodiment of the electronic circuit according to the invention. In this second example, the connection control module is adapted to disconnecting the test input of several configurable cells and to applying random data to the test inputs of the disconnected cells.

From a practical point of view, in this example, the configurable cells have been separated into X segments each comprising a variable number of series-connected configurable cells. The first segment comprises the cells 2a to 2d, the second segment comprises the cells 2e to 2m, . . . , and the last segment comprises the cells 2q to 2z. In each segment, the cells are series-associated via their test input 212 and their output 221.

The connection control module comprises a number of multiplexers 320a to 320p equal to the number of segments minus one (X−1). It also has an identification module 310 and a random-data generator 330.

The formation inputs of the test register of the multiplexers 320a to 320p are effectively connected to the data output of the last configurable cell of the first segment, the second segment, . . . , and the last segment. The data inputs of the multiplexers 320a to 320p are respectively connected to data outputs of the generator 330. The outputs of the multiplexers 320a to 320p are respectively connected to the test input of the first configurable cell of the first segment, the second segment, . . . , and the last segment. Finally, the selection inputs of all the multiplexers 320a to 320p are connected together to the output of the identification module 310.

That which is claimed:

1. An electronic circuit comprising:
   a plurality of configurable cells each comprising a test input and an output and being connected to one another in a chain via the test inputs and outputs to form a test shift register, the test shift register being formed based on said plurality of configurable cells receiving a chaining command signal; and
   a connection control module adapted for disconnecting the test input of at least one configurable cell to be disconnected based on receiving an invalid identification key, said connection control module also adapted for
      leaving disconnected the test input of said at least one configurable cell, or
      applying a signal to the test input of said at least one configurable cell, or
      connecting the test input of said at least one configurable cell to an output of a random-data generator.

2. An electronic circuit according to claim 1, wherein said connection control module disconnects the respective test inputs for at least two configurable cells to be disconnected based on receiving the invalid identification key.

3. An electronic circuit according to claim 1, wherein said connection control module is also adapted for applying random data to the test input of said at least one configurable cell after being disconnected.

4. An electronic circuit according to claim 1, wherein said connection control module comprises:
   an identification module for receiving the identification key, and for producing a validation signal if the identification key is valid; and
   a respective multiplexer associated with each configurable cell to be disconnected, and comprising
      an input connected to the output of a configurable cell preceding the configurable cell to be disconnected, and for forming the test shift register,
      a data input,
      an output connected to the test input of the configurable cell to be disconnected, and
      a selection input connected to an output of said identification module.

5. An electronic circuit according to claim 4, wherein said connection control module further comprises a random data generator having an output connected to the data input of each respective multiplexer.

6. An electronic circuit according to claim 4, wherein at least two configurable cells are to be disconnected; and wherein said connection control module comprises a respective multiplexer for each configurable cell to be disconnected.

7. An electronic circuit according to claim 1, wherein said at least two configurable cells to be disconnected are evenly distributed in the test shift register.

8. An electronic circuit according to claim 1, wherein said at least one configurable cell to be disconnected is chosen randomly from among all of said plurality of configurable cells.

9. An electronic circuit comprising:
   a plurality of configurable cells each comprising a test input and an output and being connected to one another in a chain to form a test shift register, the test shift register being formed based on said plurality of configurable cells receiving a chaining command signal; and
   a connection control module adapted for disconnecting the test inputs of the configurable cells to be disconnected based on receiving an invalid identification key, said connection control module comprising
      an identification module for receiving the identification key, and for producing a validation signal if the identification key is valid, and
      a respective multiplexer associated with each configurable cell to be disconnected, each respective multiplexer comprising an input connected to the output of a configurable cell preceding the configurable cell to be disconnected, and an output connected to the test input of the configurable cell to be disconnected;
   said connection control module also adapted for leaving disconnected the test input of each configurable cell being disconnected, or applying a signal to the test input of each configurable cell being disconnected, or connecting the test input of each configurable cell being disconnected to an output of a random-data generator.

10. An electronic circuit according to claim 9, wherein said connection control module disconnects the respective test inputs for at least two configurable cells to be disconnected based on receiving the invalid identification key.

11. An electronic circuit according to claim 9, wherein said connection control module is also adapted for applying random data to the test input of each configurable cell after being disconnected via the respective multiplexers.

12. An electronic circuit according to claim 9, wherein each respective multiplexer further comprises:
   a data input; and
   a selection input connected to an output of said identification module.

13. An electronic circuit according to claim 12, wherein said connection control module further comprises a random data generator having an output connected to the data input of each respective multiplexer.

14. An electronic circuit according to claim 9, wherein said configurable cells to be disconnected are evenly distributed in the test shift register.

15. An electronic circuit according to claim 9, wherein said configurable cells to be disconnected are chosen randomly from among all of said plurality of configurable cells.

16. A chip card comprising:
   a plurality of logic cells; and
   a plurality of configurable cells coupled to said plurality of logic cells, each configurable cell comprising a test input and an output and being connected to one another in a chain via the test inputs and outputs to form a test shift register, the test shift register being formed based on said plurality of configurable cells receiving a chaining command signal; and a connection control module adapted for disconnecting the test input of at least one configurable cell to be disconnected based on receiving an invalid identification key, said connection control module also adapted for leaving disconnected the test input of said at least one configurable cell, or applying a signal to the test input of said at least one configurable cell, or connecting the test input of said at least one configurable cell to an output of a random-data generator.

17. A chip card according to claim 16, wherein said connection control module disconnects the respective test inputs for at least two configurable cells to be disconnected based on receiving the invalid identification key.

18. A chip card according to claim 16, wherein said connection control module is also adapted for applying random data to the test input of said at least one configurable cell after being disconnected.

19. A chip card according to claim 16, wherein said connection control module comprises:

an identification module for receiving the identification key, and for producing a validation signal if the identification key is valid; and a respective multiplexer associated with each configurable cell to be disconnected, and comprising an input connected to the output of a configurable cell preceding the configurable cell to be disconnected, and for forming the test shift register, a data input, an output connected to the test input of the configurable cell to be disconnected, and a selection input connected to an output of said identification module.

20. A chip card according to claim 19, wherein said connection control module further comprises a random data generator having an output connected to the data input of each respective multiplexer.

21. A chip card according to claim 19, wherein at least two configurable cells are to be disconnected; and wherein said connection control module comprises a respective multiplexer for each configurable cell to be disconnected.

22. A chip card according to claim 16, wherein said at least two configurable cells to be disconnected are evenly distributed in the test shift register.

23. A chip card according to claim 16, wherein said at least one configurable cell to be disconnected is chosen randomly from among all of said plurality of configurable cells.

24. A method for operating an electronic circuit comprising a plurality of configurable cells each comprising a test input and an output and being connected to one another in a chain via the test inputs and outputs to form a test shift register, and a connection control module coupled to the plurality of configurable cells, the method comprising:

providing a chaining command signal to the plurality of configurable cells for forming the test shift register; and disconnecting via the connection control module the test input of at least one configurable cell to be disconnected based on the connection control module receiving an invalid identification key, the connection control module also adapted for leaving disconnected the test input of the at least one configurable cell, or applying a signal to the test input of the at least one configurable cell, or connecting the test input of the at least one configurable cell to an output of a random-data generator.

25. A method according to claim 24, wherein the connection control module disconnects the respective test inputs for at least two configurable cells to be disconnected based on receiving the invalid identification key.

26. A method according to claim 24, wherein the connection control module is also adapted for applying random data to the test input of the at least one configurable cell after being disconnected.

27. A method according to claim 24, wherein the connection control module comprises an identification module for receiving the identification key, and for producing a validation signal if the identification key is valid.

28. A method according to claim 27, wherein the connection control module further comprises a respective multiplexer associated with each configurable cell to be disconnected, each multiplexer comprising an input connected to the output of a configurable cell preceding the configurable cell to be disconnected, and for forming the test shift register;

a data input;

an output connected to the test input of the configurable cell to be disconnected; and a selection input connected to an output of the identification module.

29. A method according to claim 28, wherein the connection control module further comprises a random data generator having an output connected to the data input of each respective multiplexer.

30. A method according to claim 28, wherein at least two configurable cells are to be disconnected; and wherein the connection control module comprises a respective multiplexer for each configurable cell to be disconnected.

31. A method according to claim 24, wherein the at least two configurable cells to be disconnected are evenly distributed in the test shift register.

32. A method according to claim 24, wherein the at least one configurable cell to be disconnected is chosen randomly from among all of the plurality of configurable cells.

* * * * *